(12) United States Patent
Jain

(10) Patent No.: US 11,070,208 B2
(45) Date of Patent: Jul. 20, 2021

(54) LEVEL SHIFTER

(71) Applicant: Taiwan Semiconductor Manufacturing Company, Ltd., Hsinchu (TW)

(72) Inventor: Sanjeev Kumar Jain, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/573,426

(22) Filed: Sep. 17, 2019

(65) Prior Publication Data
US 2021/0082477 A1  Mar. 18, 2021

(51) Int. Cl.
| H03K 19/0175 | (2006.01) |
| G11C 5/14 | (2006.01) |
| H03K 3/356 | (2006.01) |
| G11C 11/417 | (2006.01) |

(52) U.S. Cl.
CPC ......... *H03K 19/0175* (2013.01); *G11C 5/147* (2013.01); *G11C 11/417* (2013.01); *H03K 3/356104* (2013.01)

(58) Field of Classification Search
CPC ....... G11C 5/147; G11C 11/417; G11C 11/56; H03K 3/356104; H03K 19/0175

USPC .................................... 326/80, 81; 327/333
See application file for complete search history.

(56) References Cited

U.S. PATENT DOCUMENTS

| 10,536,147 B1* | 1/2020 | Kumar ........... H03K 19/018521 |
| 2002/0011873 A1* | 1/2002 | Riccio .............. H03K 3/356113 |
| | | 326/80 |
| 2016/0134286 A1* | 5/2016 | Bowles ................ H03K 17/002 |
| | | 327/333 |

* cited by examiner

*Primary Examiner* — William Hernandez
(74) *Attorney, Agent, or Firm* — Merchant & Gould P.C.

(57) ABSTRACT

A voltage level shifter for an SRAM device includes a level shifter input and provides a second voltage level. A voltage input terminal receives a first signal at a first voltage level and an inverter having an input and an output with the voltage input terminal is connected to the inverter input. A first voltage selector selectively applies an intermediate voltage to the gate of a PMOS transistor in a first complementary pair when the voltage of a complementary level shift output voltage rises to a logical 1 and a second voltage selector applies the intermediate voltage to the gate of a PMOS transistor in a second complementary pair when the voltage of the level shift output voltage node rises to a logical 1. The PMOS transistor current is thereby reduced resulting in lower energy dissipation and supporting a larger voltage separation between the first and second voltage levels.

20 Claims, 6 Drawing Sheets

LEVEL SHIFTER

BACKGROUND

A common type of integrated circuit memory is a static random access memory (SRAM) device. A typical SRAM memory device includes an array of memory cells, with each memory cell having six transistors connected between an upper reference potential and a lower reference potential (typically ground). Each memory cell has two storage nodes where information may be stored. The first node stores the desired information, while the complementary information is stored at the second storage node.

A "dual rail" SRAM architecture refers to an SRAM arrangement where certain memory logic is operated in a low voltage domain, while the memory array is operated in the high voltage domain. By operating the SRAM array in the high voltage domain, the static noise margins are improved such that the individual memory cells are able to maintain the desired logic states when exposed to noise. Additionally, memory leakage power is reduced significantly. The gain in leakage power increases as the difference in the high voltage and low voltage value increases.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
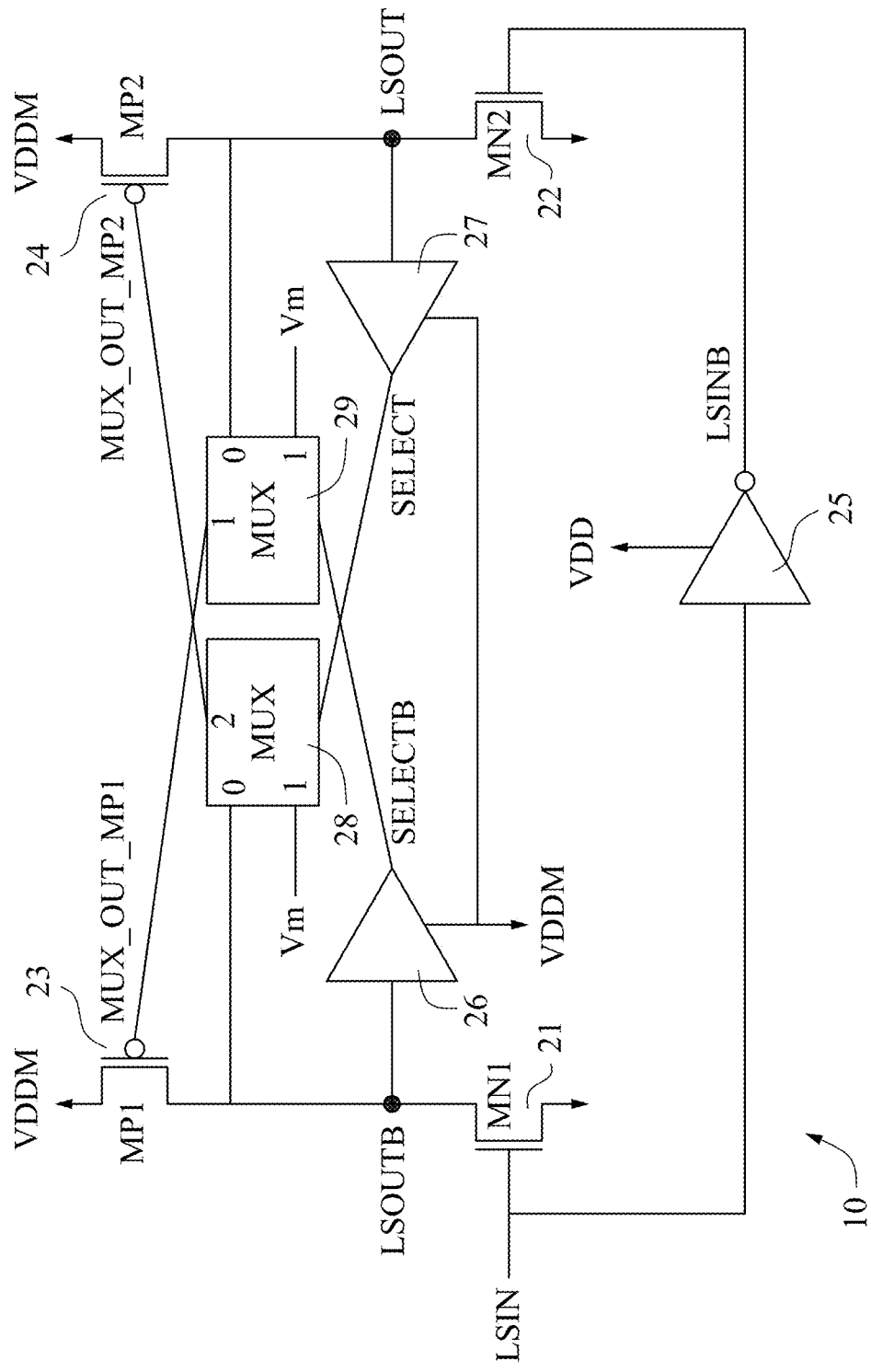
FIG. 1 is a circuit diagram illustrating aspects of an example low voltage level shifter in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some electric devices and circuits operate in multiple voltage domains. For example, a static random access memory (SRAM) device has an array of memory cells that include transistors connected between an upper reference potential and a lower reference potential such that one of two storage nodes can be occupied by the information to be stored, with the complementary information stored at the other storage node. For example, one typical SRAM memory cell arrangement includes six transistors. Each bit in the SRAM cell is stored on four of the transistors, which form two cross-coupled inverters. The other two transistors are connected to the memory cell word line to control access to the memory cell during read and write operations by selectively connecting the cell to its bit lines.

In a read operation, for example, the memory cell bit lines are precharged to a predefined threshold voltage. When the word line is enabled, a sense amplifier connected to the bit lines senses and outputs stored information.

A "dual rail" SRAM architecture refers to an SRAM arrangement where certain memory logic is operated in a low voltage domain, while the memory array is operated in a high voltage domain. Known dual rail SRAM arrangements can reduce memory leakage power, but memory access time can be adversely impacted. Further, as the difference between the voltage levels of the high and low voltage domains increases, leakage and noise may increase.

Thus, a level shifter that achieves a wide range of voltages with low energy dissipation is desired for system on a chip environments and other circuits operating in multiple voltage domains, such as dual rail SRAM. Embodiments constructed in accordance with the principles of the present invention provide improved voltage separation between first and second power supply voltage levels, $V_{dd}$ and $V_{ddm}$. For example, previous level shifters often supported a maximum separation of 350 mV between $V_{dd}$ and $V_{ddm}$, while present embodiments may support a 500 mV separation. Accordingly, in some embodiments the voltage difference between the first and second power supply voltage levels, $V_{dd}$ and $V_{ddm}$, is 350 mV to 500 mV. Other advantages include improved delay at low $V_{dd}$ and reduced energy dissipation for large separation of $V_{dd}$ and $V_{ddm}$.

Turning now to FIG. 1, an embodiment of a low voltage level shifter in accordance with the principles of the present invention is disclosed. The level shifter is shown generally at 10. A level shift input signal (LSIN) signal is provided to the gate of NMOS transistor 21 and to inverter 25. NMOS transistor 21 is connected to PMOS transistor 23 with a node corresponding to the level shift output signal B (LSOUTB) between the two transistors. Node LSOUTB is the input to first amplifier 26 and is one of the two input signals for first multiplexer 28. The output of first amplifier 26 is signal SELECTB. This signal is provided to second multiplexer 29 as the selector signal between the two inputs, LSOUTB and $V_m$. Briefly, $V_m$ is a reduced supply voltage having a level between the first and second supply voltages, $V_{dd}$ and $V_{ddm}$. Accordingly, it is referred to herein as an intermediate or third voltage level. A representative manner by which $V_m$ may be generated is presented further below.

A complimentary arrangement of transistors and devices are disposed opposing the circuit described in the previous paragraph, with the output of inverter 25 (designated LSINB) provided to the gate of NMOS transistor 22. Node LSOUT is located between NMOS transistor 22 and PMOS transistor 24. The LSOUT signal is provided to the input of second amplifier 27 and is one of the two input signals for second multiplexer 29. The output of second amplifier 27 is signal SELECT. This signal is provided to first multiplexer 28 as the selector signal between the two inputs, LSOUT and $V_m$.

First and second multiplexers 28, 29 each include two input signals and one selector signal. The first input signal is LSOUTB for first multiplexer 28 and LSOUT for second multiplexer 29. These input signals are selected when the selector signal is a logical 0. The second input signal for both first multiplexer 28 and second multiplexer 29 is $V_m$. The input signal $V_m$ is selected when the selector signal is a logical 1. The output of first multiplexer 28 is signal MUX_OUT_MP2 which is applied to the gate of PMOS transistor 24. The output of second multiplexer 29 is signal MUX_OUT_MP1 which is applied to the gate of PMOS transistor 23.

First and second multiplexers 28, 29 act as a voltage selector and use similar logic. More specifically, a logical 1 selector signal selects the $V_m$ input and a logical 0 selector signal selects the LSOUTB input (for first multiplexer 28) and the LSOUT input (for second multiplexer 29). The resulting logical selection of inputs is summarized in the following two tables.

TABLE 1

| LSOUTB | SELECTB | MUX OUT MP1 | Applied PMOS Gate Voltage |
|---|---|---|---|
| LOW | LOW | LSOUT | HIGH |
| HIGH | HIGH | Vm | Vm |

TABLE 2

| LSOUT | SELECT | MUX OUT MP2 | Applied PMOS Gate Voltage |
|---|---|---|---|
| LOW | LOW | LSOUTB | HIGH |
| HIGH | HIGH | Vm | Vm |

As can be seen from TABLE 1 and TABLE 2, the multiplexers 28, 29 select between a high voltage present at the LSOUT and LSOUTB voltage nodes and $V_m$. Accordingly, a high voltage is applied to both of the PMOS transistor 23, 24 gates assisting the PMOS transistors 23, 24 to remain in a high resistance state or quickly return to a high resistance state during rises and falls of the LSIN signal. This reduces the current in the PMOS transistors and so the circuit is faster than previous level shift circuits.

Additionally, in previous level shift circuits the current of the PMOS transistor was larger when $V_{ddm} > V_{dd}$. By including multiplexers 28, 29 into the circuit and selectively applying $V_m$ to the PMOS transistor gates, power dissipation is reduced by 43% in some embodiments. For example, compared to previous level shift circuits where $V_{dd}=0.6V$ and $V_{ddm}=0.950V$, by using a level shifter constructed in accordance with the principles of the present invention, $V_{dd}$ can be reduced from 0.6V to 0.45V. Although the addition of the multiplexers requires some additional chip area, it is estimated that the additional area is less as compared to the total area of the memory circuit, and would not exceed 0.5%.

Turning now to a more detailed discussion of the operation of the level shifter 10, as noted above, at least one input signal LSIN is provided to the level shifter 10. As will be appreciated, the signal may be either a rising signal from a logic state 0 to a logic state 1 or a falling signal from a logic state 1 and logic state 0. The operation of level shifter 10 will be first described for a falling LSIN signal and then described in connection with a rising LSIN signal.

Figure 2:
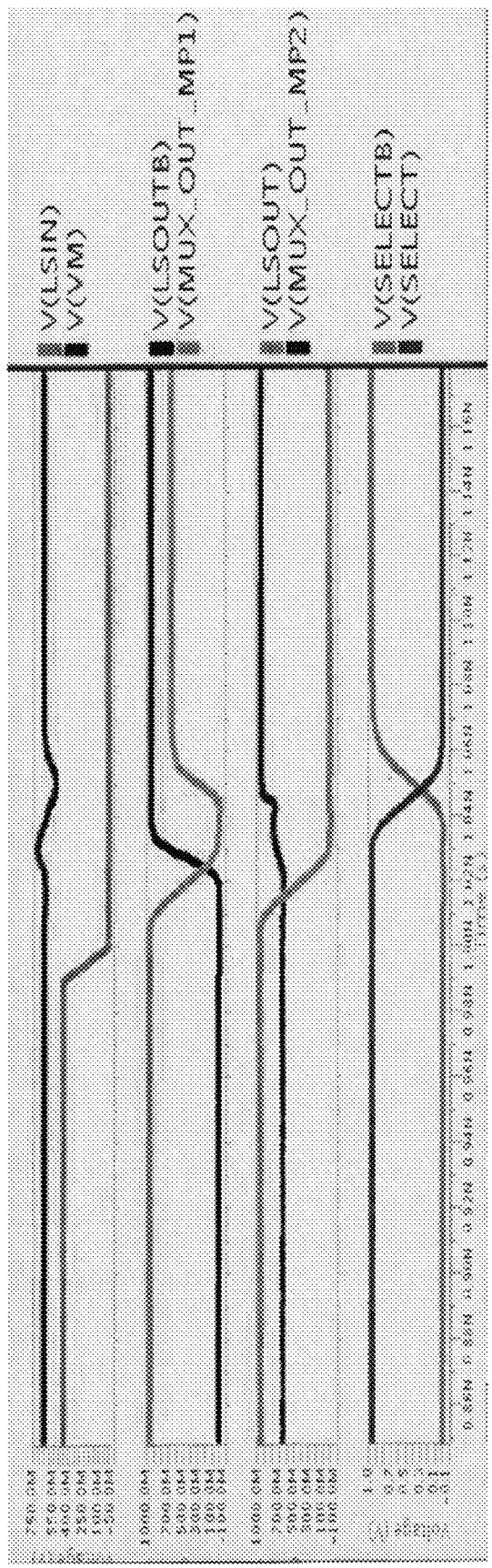
FIG. 2 is a simulated timing diagram in accordance with some embodiments illustrating representative voltage levels over time at various nodes of the level shifter of FIG. 1 as the level shift input signal (LSIN) falls.

Referring now to FIG. 1 and FIG. 2, as described above, the LSIN signal is initially applied to the gate of NMOS transistor 21 and to inverter 25. When the LSIN signal falls, NMOS transistor 21 turns off and the voltage at node LSOUTB rises. This rising voltage is applied to first amplifier 26 and the resulting high SELECTB voltage is provided as the selector to second multiplexer 29. As noted in Table 1 above, since the selector voltage is logical high, the output signal MUX_OUT_MP1 from second multiplexer 29 is the voltage $V_m$ and this voltage is applied to the gate of PMOS transistor 23.

The LSIN signal is also provided to the complementary components of the level shifter 10 after being inverted to LSINB by inverter 25 (e.g., LSINB is a rising signal). The LSINB signal is applied to the gate of NMOS transistor 22, causing the transistor to turn on and the voltage at the LSOUT node falls. This falling voltage is applied to second amplifier 27 and the low logic SELECT voltage is provided as the selector to first multiplexer 28. As noted in Table 2 above, since the selector voltage is logical low, the output signal MUX_OUT_MP2 from first multiplexer 28 is the high voltage present at node LSOUTB and this voltage is applied to the gate of PMOS transistor 24.

A simulation of the waveforms of the voltage levels at various nodes of the level shifter 10 over time in connection with a falling LSIN signal is illustrated in FIG. 2. As can be seen in the timing diagram, the voltage applied to the gate of PMOS transistor 24 changes from a logical 1 to a logical 0. Since LSOUTB is initially low, the SELECTB selector is also low and the output of second multiplexer 29 (MUX_OUT_MP1) is the LSOUT signal. As the voltage levels for LSOUT falls and LSOUTB rises, the MUX_OUT_MP1 level decreases with the falling out LSOUT signal until the SELECTB signal rises to a logical 1 level. At this point the output of second multiplexer 29 switches to the output to $V_m$.

The output (MUX_OUT_MP2) of the first multiplexer 28 is initially $V_m$ with a high LSOUT level. When LSOUT falls to a logical 0, then the first multiplexer 28 selects the LSOUTB level as the output to the gate of PMOS transistor 24.

Figure 3:
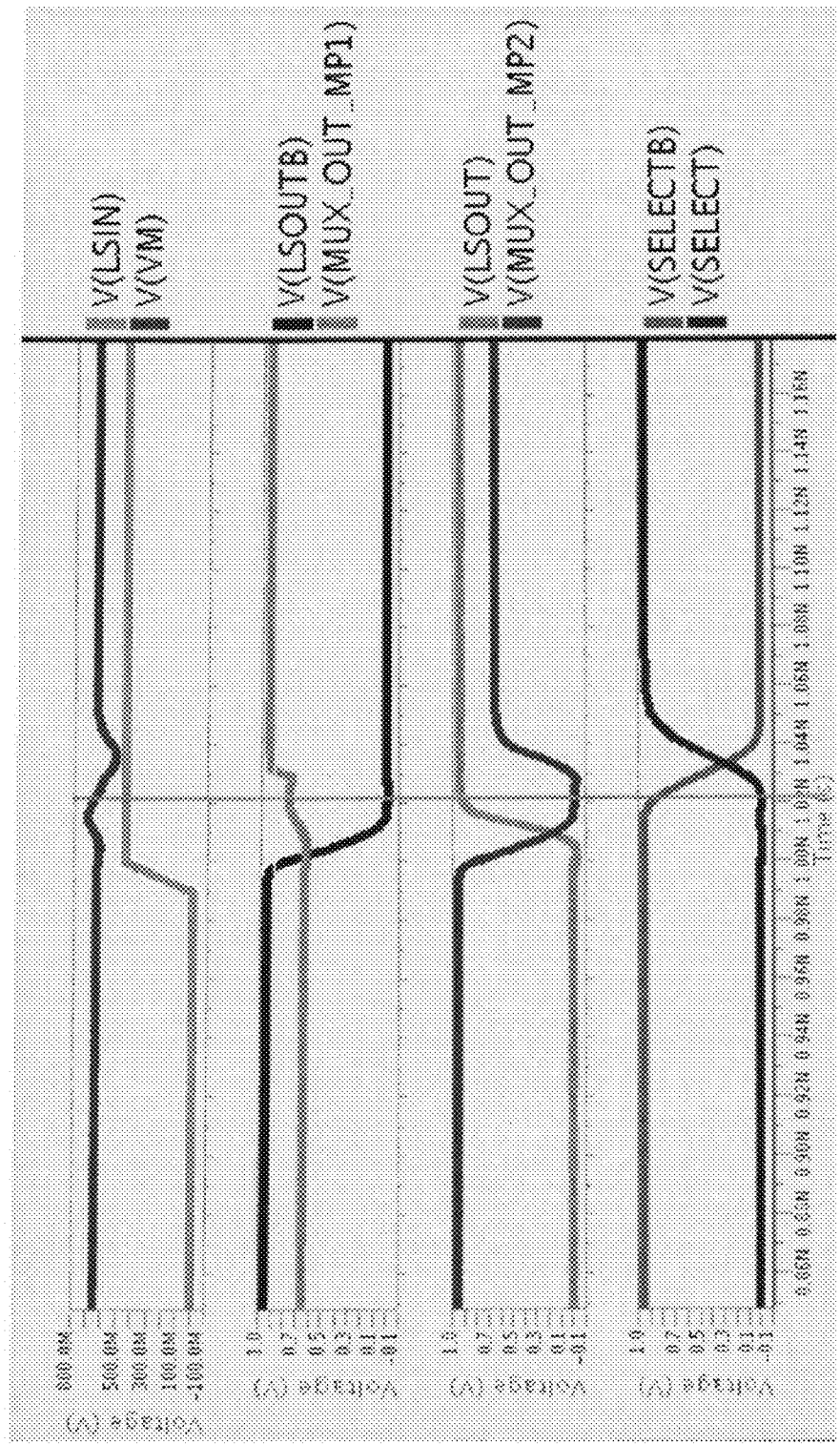
FIG. 3 is a simulated timing diagram in accordance with some embodiments illustrating representative voltage levels over time at various nodes of the level shifter of FIG. 1 as the level shift input signal (LSIN) rises.

Next referring to FIG. 3, the operation of the level shifter 10 is shown with simulated waveforms for a rising LSIN signal at the nodes and outputs described above in connection with FIG. 1. As shown in FIG. 3, the various voltages and waveforms with a rising LSIN input signal are complementary to the falling LSIN signal. Accordingly, for a rising LSIN signal, the MUX_OUT_MP1 signal takes the form of the MUX_OUT_MP2 voltage level as described above with the rising LSIN signal and the MUX_OUT_MP2 signal takes the form of the MUX_OUT_MP1 voltage level.

As noted above, the voltage $V_m$ is an intermediate or third voltage level and may be established at a level between the first and second supply voltages, $V_{dd}$ and $V_{ddm}$. When $V_{dd}$ is the lower supply voltage, it may be considered for use as the voltage $V_m$. However, a higher voltage may be required for the level shifter 10 to operate in accordance with design and component requirements. Therefore, $V_m$ may be established in accordance with the following formula (1):

$$V_m \sim \text{MAX}[V_{dd}, V_{ddm} - n*|V_{Tp}|] \qquad (1)$$

Figure 4:
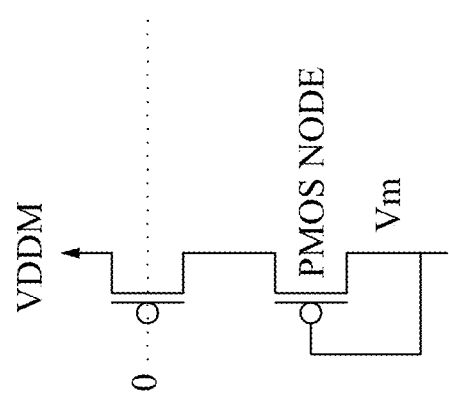
FIG. 4 is a circuit diagram of a representative PMOS diode which may be used to generate the voltage $V_m$ in accordance with some embodiments.

In formula (1), $V_m$ is approximately equal to the maximum value of $V_{dd}$ or of $V_{ddm}$ minus the threshold voltage (e.g., $V_{tp}$) of a PMOS diode utilized to generate $V_m$. In this representative formula, the value of "n" equals the number of diodes utilized. For example, if a single diode is used, then the value of n=1; if two diodes are used, then the value of n=2; and so on. FIG. 4 illustrates a representative structure of a PMOS diode circuit that may be utilized to generate $V_m$. In the example diode structure shown in FIG. 4, $V_m = V_{ddm} - V_{Tp}$. It will be appreciated, however, that many other diode types and configurations may be used to generate $V_m$ from $V_{ddm}$. Further, other structures and manners of generating $V_m$ from $V_{ddm}$ are also possible. Thus, the term $V_{Tp}$ as used herein is defined to include such other threshold voltages and other voltage drops associated with alternative diode types, diode configurations, structures and manners (collectively referred to herein as "threshold voltages" for convenience).

Figure 5:
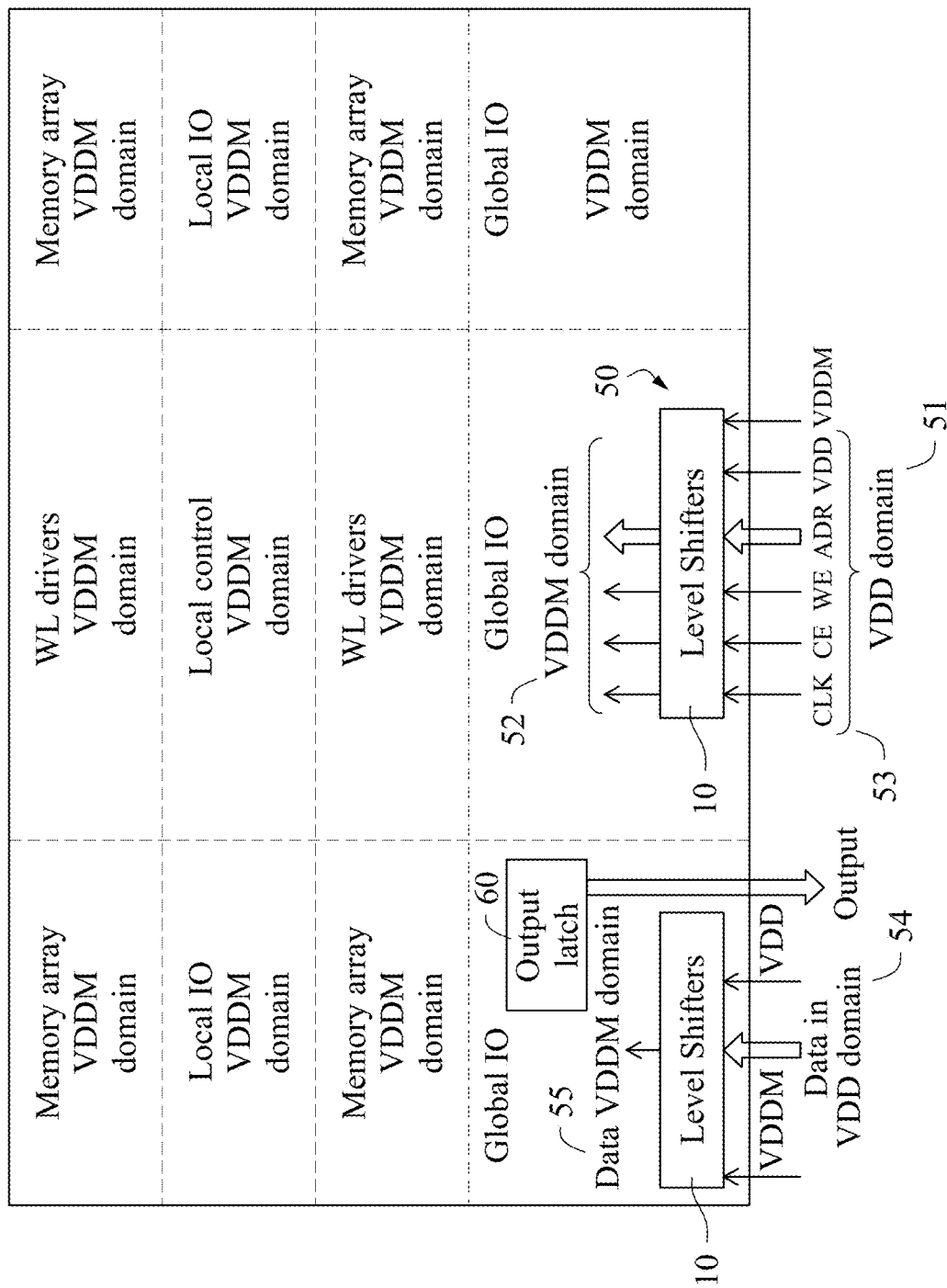
FIG. 5 is a block diagram illustrating aspects of example inputs to the low voltage level shifter of FIG. 1 and the representative relationship of level shifters to the memory arrays, word line drivers, local input/output, and local control operating in the $V_{DDM}$ domain in accordance with some embodiments.

Turning to FIG. 5 the transition from the $V_{dd}$ domain 51 to the $V_{ddm}$ domain 52 is illustrated in accordance with some embodiments. The various level shift signal inputs from the $V_{dd}$ domain to the $V_{DDM}$ domain designated at 53 include, for example, a clock signal, chip enable (CE), write enable (WE), address, and $V_{dd}$. In addition, $V_{ddm}$ is provided to the level shift block 10. Thus, while a single level shift block 10 is shown and described above, it will be appreciated that there is a plurality of level shift circuits 10 in block 10—with each level shift circuit handling the level shift for a single bit that is transitioned between the $V_{dd}$ and $V_{ddm}$ domains.

Still referring to FIG. 5, there is also illustrated a second level shift block 10 having data from the $V_{dd}$ domain (illustrated at designation 54) as the input to level shift block 10. Since the data may be in the form of an address or value of several bits, there is a plurality of level shift circuits 10 in block 10. Output latch 60 provides data back to the $V_{dd}$ domain. Also illustrated in FIG. 5 is at least one memory array (e.g., a plurality of SRAM devices forming a memory array), word line drivers, local input-output, and local control blocks in the $V_{ddm}$ domain. In other embodiments, there are a plurality of each of these blocks.

While not explicitly shown and as mentioned above, the memory array of FIG. 5 may be comprised of one or more SRAM devices. Each SRAM device may be formed as a six-transistor SRAM memory cell. However, other SRAM memory cell arrangements could be employed in other embodiments.

As an alternative embodiment, in lieu of multiplexers, combinational logic could be used to apply $V_m$ to the PMOS gates in accordance with the logic described above in Table 1 and Table 2.

Figure 6:
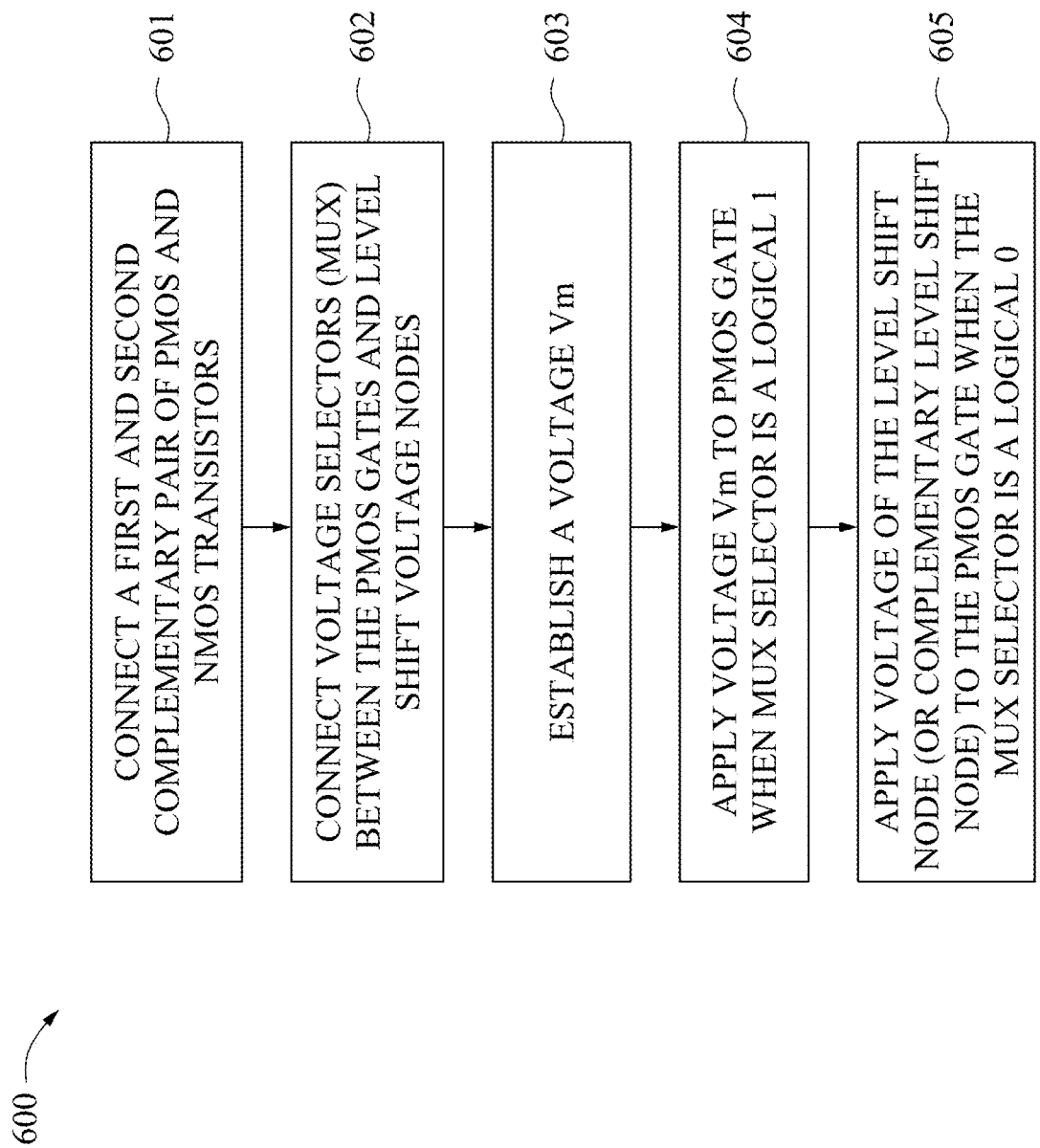
FIG. 6 is a representative block diagram of a method which may be employed by a level shifter in accordance with some embodiments.

Referring to FIG. 6, a method for a low voltage level shift device for a dual rail SRAM architecture in accordance with some embodiments is disclosed generally at 600. First, at block 601, first and second complementary pairs of PMOS and NMOS transistors are connected with their drains tied together. The tied drains form a complementary level shift output voltage node and a level shift output voltage node for the first and second complementary pair of transistors, respectively. At block 602, a first voltage selector is connected between the level shift output voltage node and the gate of the PMOS transistor in the first complementary pair and a second voltage selector is connected between the complementary level shift output node and the PMOS transistor in the second complementary pair. An example circuit in accordance with some embodiments is illustrated in FIG. 1. At block 603, a voltage $V_m$ is established. As noted above in connection with FIG. 4, in some embodiments $V_m$ may be $V_{dd}$ or some other intermediate voltage between the values of first and second supply voltages, $V_{dd}$ and $V_{ddm}$.

At block 604, voltage $V_m$ is applied to the gate of the PMOS transistor 23 in the first complementary pair when the voltage of the complementary level shift output voltage node (LSOUTB) rises to a logical 1 and voltage $V_m$ is applied to the gate of the PMOS transistor 24 in the second complementary pair when the voltage of the level shift output voltage node (LSOUT) rises to a logical 1. By applying $V_m$ to the gate of PMOS transistor 23 or 24, the corresponding PMOS transistor current is reduced as it turns off and has a high resistance.

At block 605, the voltage of the level shift output voltage node (LSOUT) is applied to the gate of the PMOS transistor 23 in the first complementary pair when the voltage of the complementary level shift output voltage node (LSOUTB) falls to a logical 0 and the voltage of the complementary level shift output voltage node (LSOUTB) is applied to the gate of the PMOS transistor 24 in the second complementary pair when the voltage of the level shift output voltage node (LSOUT) falls to a logical 0. The method may be utilized, for example, in connection with a plurality of level shifters 50 (best seen in FIG. 5) for a plurality of input signals 53 operating at the first level ($V_{dd}$) to a second higher voltage level ($V_{ddm}$) and connecting the plurality of higher voltage level signals to devices and circuits operating in multiple voltage domains, such as a memory array of SRAM devices.

Disclosed embodiments include a level shifter of the type used in multiple voltage domains, and includes at least one level shifter input and provides a second voltage level from a first voltage level. A voltage input terminal receives a first signal operating at the first voltage level ($V_{dd}$). The voltage input terminal is also connected to an input of an inverter, where the inverter further includes an output. First and second complementary pairs of PMOS and NMOS transistors have their drains connected together, the connected drains establishing a complementary level shift output voltage node and a level shift output voltage node, respectively. A first voltage selector is connected between the level shift output node and the gate of the PMOS transistor in the first complementary pair and a second voltage selector is connected between the complementary level shift output node and the PMOS transistor in the second complementary pair. The first voltage selector selectively applies an intermediate voltage ($V_m$) to the gate of the PMOS transistor in the first complementary pair when the voltage of the complementary level shift output voltage node rises to a logical 1 and the second voltage selector applies the intermediate voltage ($V_m$) to the gate of the PMOS transistor in the second complementary pair when the voltage of the level shift output voltage node rises to a logical 1.

In accordance with further disclosed embodiments, a voltage level shift circuit, includes a voltage input terminal configured to receive a first signal operating at a first voltage level ($V_{dd}$). An inverter, having an input and an output, is also connected to the voltage input terminal. A first NMOS transistor having a drain and a gate is connected to the first voltage level and a second NMOS transistor having a drain and a gate connected to the output of the inverter. A first PMOS transistor having a gate and a drain is connected to the first NMOS transistor drain, where the connected drains form a complement level shift output node. A second PMOS transistor having a gate and a drain is connected to the second NMOS transistor drain, where the tied drains form a level shift output node. The level shift output node and the complement level shift output nodes operate at a second voltage level ($V_{ddm}$) greater than the first voltage level ($V_{dd}$). A voltage selector is connected between the level shift output node and the gate of the second PMOS transistor and between the complement level shift output node and the first PMOS transistor. The voltage selector applies a third voltage ($V_m$) to the gate of the second PMOS transistor when the level shift output node rises to a logical 1 and to the gate of the first PMOS transistor when the complement level shift output node rises to a logical 1.

In accordance with still further disclosed embodiments there is a method for a voltage level shift device, comprising: configuring a voltage input terminal to receive a first signal operating at a first voltage level ($V_{dd}$) and inverting the signal; connecting a first complementary pair of PMOS and NMOS transistors with their drains together, the drains forming a complementary level shift output voltage node, and connecting the voltage input terminal to the gate of the NMOS transistor in the first complementary pair; connecting a second complementary pair of PMOS and NMOS transistors with their drains together, the drains establishing a level shift output voltage node, connecting the inverted signal to the gate of the NMOS transistor in the second complementary pair; connecting a first voltage selector between the level shift output node and the gate of the PMOS transistor in the first complementary pair and a second voltage selector between the complementary level shift output node and the PMOS transistor in the second complementary pair; selectively applying an intermediate voltage ($V_m$) to the gate of the PMOS transistor in the first complementary pair when the voltage of the complementary level shift output voltage node rises to a logical 1; and selectively applying the intermediate voltage ($V_m$) to the gate of the PMOS transistor in the second complementary pair when the voltage of the level shift output voltage node rises to a logical 1.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A voltage level shift device, comprising:
   a) a voltage input terminal configured to receive a first signal operating at a first voltage level and an inverter having an input and an output with the voltage input terminal being connected to the inverter input;
   b) a first complementary pair of PMOS and NMOS transistors with their drains connected together, the connected drains establishing a complementary level shift output voltage node, and the voltage input terminal connected to the gate of the NMOS transistor in the first complementary pair;
   c) a second complementary pair of PMOS and NMOS transistors with their drains connected together, the connected drains establishing a level shift output voltage node, and the output of the inverter connected to the gate of the NMOS transistor in the second complementary pair;
   d) a first voltage selector connected between the level shift output node and the gate of the PMOS transistor in the first complementary pair, the first voltage selector including a selector input connected to the complementary level shift output voltage node, and a second voltage selector connected between the complementary level shift output node and the PMOS transistor in the second complementary pair, the second voltage selector including a selector input connected to the level shift output voltage node, the first voltage selector selectively applying an intermediate voltage to the gate of the PMOS transistor in the first complementary pair when the voltage of the complementary level shift output voltage node rises to a logical 1 and the second voltage selector selectively applying the intermediate voltage to the gate of the PMOS transistor in the second complementary pair when the voltage of the level shift output voltage node rises to a logical 1; and
   e) wherein there are a plurality of input signals and a corresponding plurality of level shift devices and wherein the plurality of input signals are shifted from the first voltage level to a second voltage level greater than the first voltage level to establish a high voltage domain in which a plurality of static memory cells operate.

2. The voltage level shift device of claim 1, wherein the intermediate voltage is equal to the first voltage level.

3. The voltage level shift device of claim 1, wherein the intermediate voltage is generated with a PMOS diode and is equal to $V_{ddm} - n*|V_{Tp}|$, where n equals the number of devices used to generate the intermediate voltage, $V_{Tp}$ is the threshold voltage of one of the devices, and $V_{ddm}$ is a second voltage level applied to the sources of the PMOS transistors of the first and second complementary pairs.

4. The voltage level shift device of claim 1, wherein the first voltage selector applies the voltage at the level shift output voltage node to the gate of the PMOS transistor of the first complementary pair when the voltage at the complementary level shift output node falls to a logical 0 and wherein the second voltage selector applies the voltage at the complementary level shift output node to the gate of the second PMOS transistor when the voltage at the level shift output voltage node falls to a logical 0.

5. The voltage level shift device of claim 4, wherein the first voltage selector and the second voltage selector are multiplexers.

6. The voltage level shift device of claim 5, wherein each of the multiplexers include two inputs and a selector input.

7. The voltage level shift device of claim 1, where the voltage difference between the first voltage level and the second voltage level is 350 mV to 500 mV.

8. The voltage level shift device of claim 1, wherein the plurality of static memory cells includes a memory array of SRAM devices operatively connected to a plurality of level shift devices and operating at the second voltage level.

9. The voltage level shift device of claim 1, further comprising a memory array of SRAM devices operatively connected to a plurality of level shift devices and operating at a voltage level greater than the first voltage level; wherein each of the plurality of level shift devices include a respective voltage input terminal; and wherein the first signals applied to the voltage input terminals include clock, chip enable, and write enable signals.

10. A voltage level shift device, comprising:
   a) a voltage input terminal configured to receive a first signal operating at a first voltage level;
   b) an inverter having an input and an output, the voltage input terminal being connected to the inverter input;
   c) a first NMOS transistor having a drain, and a gate connected to the first voltage level and a second NMOS transistor having a drain, and a gate connected to the output of the inverter;
   d) a first PMOS transistor having a gate, and a drain connected to the first NMOS transistor drain, the connected drains forming a complement level shift output node, and a second PMOS transistor having a gate, and a drain connected to the second NMOS transistor drain, the tied drains forming a level shift output node, the level shift output node and the complement level shift output nodes operating at a second voltage level greater than the first voltage level;
   e) a voltage selector connected between the level shift output node and the gate of the second PMOS transistor and between the complement level shift output node and the gate of the first PMOS transistor, wherein the voltage selector has a first selector input directly connected to the level shift output node via a first amplifier and a second selector input directly connected to the complement level shift output node via a second amplifier, the voltage selector applying a third voltage to the gate of the second PMOS transistor when the level shift output node rises to a logical 1 and to the gate of the first PMOS transistor when the complement level shift output node rises to a logical 1; and
   f) wherein there are a plurality of input signals and a corresponding plurality of level shift devices, wherein the plurality of input signals are shifted from the first voltage level to the second voltage level, and further comprising a memory array of SRAM devices operatively connected to the plurality of level shift devices and operating at the second voltage level to improve operation of the memory array of SRAM devices.

11. The voltage level shift device of claim 10, wherein the third voltage is equal to the first voltage level.

12. The voltage level shift device of claim 10, wherein the third voltage is generated with a PMOS diode and is equal to $V_{ddm} - n*|V_{Tp}|$, where $V_{ddm}$ equals the second voltage level, n equals the number of PMOS diodes and $V_{Tp}$ is the threshold voltage of a PMOS transistor forming the PMOS diode.

13. The voltage level shift device of claim 10, wherein the voltage selector selects and applies the voltage at the complement level shift output node to the gate of the second PMOS transistor when the voltage at the level shift output node falls to a logical 0 and wherein the voltage selector selects and applies the voltage at the level shift output node to the gate of the first PMOS transistor when the complement level shift output node falls to a logical 0.

14. The voltage level shift device of claim 10, wherein the voltage selector includes two multiplexers.

15. The voltage level shift device of claim 14, wherein each of the two multiplexers include two inputs and a selector.

16. The voltage level shift device of claim 10, wherein the voltage selector includes combinational logic.

17. The voltage level shift device of claim 10, wherein each of the plurality of level shift devices include a respective voltage input terminal; and wherein the first signals applied to the voltage input terminals include clock, chip enable, and write enable signals.

18. A method for a voltage level shift device, comprising:
   configuring a voltage input terminal to receive a first signal operating at a first voltage level and inverting the first signal;
   connecting a first complementary pair of PMOS and NMOS transistors with their drains together, the drains forming a complementary level shift output voltage node, and connecting the voltage input terminal to the gate of the NMOS transistor in the first complementary pair;
   connecting a second complementary pair of PMOS and NMOS transistors with their drains together, the drains establishing a level shift output voltage node, and connecting the inverted first signal to the gate of the NMOS transistor in the second complementary pair;
   connecting a first voltage selector between the level shift output node and the gate of the PMOS transistor in the first complementary pair, the first voltage selector having a selector input directly connected to the complementary level shift output node through a first amplifier, and a second voltage selector between the complementary level shift output node and the PMOS transistor in the second complementary pair, the second voltage selector having a selector input directly connected to the level shift output node through a second amplifier;
   selectively applying an intermediate voltage to the gate of the PMOS transistor in the first complementary pair when the voltage of the complementary level shift output voltage node rises to a logical 1;
   selectively applying the intermediate voltage to the gate of the PMOS transistor in the second complementary pair when the voltage of the level shift output voltage node rises to a logical 1; and
   shifting a plurality of input signals operating at the first level to a second higher voltage level and connecting the plurality of higher voltage level signals to a memory array of SRAM devices, whereby operation of the memory array of SRAM devices is improved.

19. The method for a voltage level shift device according to claim 18, further comprising:
   selectively applying the voltage of the level shift output voltage node to the gate of the PMOS transistor in the first complementary pair when the voltage of the complementary level shift output voltage node falls to a logical 0; and
   selectively applying the voltage of the complementary level shift output voltage node to the gate of the PMOS transistor in the second complementary pair when the voltage of the level shift output voltage node falls to a logical 0.

20. The method for a voltage level shift device according to claim 18, wherein the voltage selector includes combinational logic.

* * * * *